(12) United States Patent
Sochava

(10) Patent No.: US 8,213,804 B2
(45) Date of Patent: Jul. 3, 2012

(54) SEMICONDUCTOR OPTICAL AMPLIFIER FOR AN EXTERNAL CAVITY DIODE LASER

(75) Inventor: Sergei Sochava, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 596 days.

(21) Appl. No.: 11/810,433

(22) Filed: Jun. 5, 2007

(65) Prior Publication Data

US 2008/0304826 A1 Dec. 11, 2008

(51) Int. Cl.
*H04B 10/00* (2006.01)

(52) U.S. Cl. ........ 398/160; 398/200; 398/201; 398/164; 398/180

(58) Field of Classification Search ............ 398/79, 398/200, 160, 201, 164, 180, 140
See application file for complete search history.

(56) References Cited

U.S. PATENT DOCUMENTS

| | | | |
|---|---|---|---|
| 5,344,746 A * | 9/1994 | Vettiger et al. ............. 430/321 |
| 5,539,571 A | 7/1996 | Welch et al. |
| 5,675,602 A * | 10/1997 | Takemoto .................. 372/50.1 |
| 6,091,755 A * | 7/2000 | Sanders et al. .............. 372/92 |
| 6,205,159 B1 * | 3/2001 | Sesko et al. ................. 372/20 |
| 6,233,045 B1 * | 5/2001 | Suni et al. ................. 356/28.5 |
| 6,625,182 B1 | 9/2003 | Kuksenkov et al. |
| 6,665,321 B1 * | 12/2003 | Sochava et al. ............. 372/20 |
| 6,763,047 B2 | 7/2004 | Daiber et al. ............... 372/34 |
| 6,853,654 B2 | 2/2005 | McDonald et al. ............ 372/20 |
| 6,940,887 B2 | 9/2005 | Sochava et al. ............. 372/92 |
| 7,257,142 B2 * | 8/2007 | Sochava et al. ............. 372/50.1 |
| 7,501,664 B2 * | 3/2009 | Yoo et al. ................... 257/96 |
| 7,558,488 B2 * | 7/2009 | Matsui et al. ............... 398/201 |
| 7,570,845 B2 * | 8/2009 | Welch et al. ................ 385/14 |
| 7,599,403 B2 * | 10/2009 | Park et al. .................. 372/1 |
| 7,609,977 B2 * | 10/2009 | Matsui et al. ............... 398/201 |
| 7,636,522 B2 * | 12/2009 | Nagarajan et al. ........... 398/79 |
| 7,809,280 B2 * | 10/2010 | Mahgerefteh et al. ........ 398/185 |
| 2004/0042069 A1 * | 3/2004 | Fisher ...................... 359/344 |
| 2004/0113056 A1 * | 6/2004 | Everall et al. .............. 250/227.23 |
| 2004/0170208 A1 * | 9/2004 | Sochava ..................... 372/97 |
| 2004/0202402 A1 * | 10/2004 | Glogovsky et al. ........... 385/14 |
| 2005/0213618 A1 * | 9/2005 | Sochava et al. ............. 372/20 |
| 2005/0254056 A1 * | 11/2005 | Kachanov et al. ........... 356/437 |
| 2006/0140228 A1 * | 6/2006 | McDonald et al. ........... 372/20 |
| 2007/0122148 A1 * | 5/2007 | Welch et al. ................ 398/27 |
| 2007/0286605 A1 * | 12/2007 | Feuer et al. ................ 398/83 |

(Continued)

OTHER PUBLICATIONS

Korean Patent Office, International Search Report and Written Opinion for International Application No. PCT/US2008/064586, 10 pages, Sep. 30, 2008.

(Continued)

*Primary Examiner* — Kenneth N Vanderpuye
*Assistant Examiner* — Hibret Woldekidan
(74) *Attorney, Agent, or Firm* — Trop, Pruner & Hu, P.C.

(57) ABSTRACT

In one embodiment, a gain medium for an external cavity diode laser (ECDL) includes a gain section to provide a gain operation on optical energy in the ECDL that is controlled by a first electrical signal, a semiconductor optical amplifier (SOA) section disposed adjacent to the gain section to amplify the gained optical energy responsive to a second electrical signal, and a trench disposed between the gain section and the SOA section to act as an integrated mirror. Other embodiments are described and claimed.

11 Claims, 4 Drawing Sheets

U.S. PATENT DOCUMENTS

2008/0159751 A1* 7/2008 Matsui et al. ............... 398/183
2011/0110388 A1* 5/2011 Baroni et al. ................. 372/26

OTHER PUBLICATIONS

Chinese Patent Office, First Office Action mailed Dec. 6, 2010 in Chinese patent application No. 200880018741.5.

Taiwan Patent and Trademark Office, Office Action mailed Sep. 26, 2011 in Taiwan application No. 097119388.

Chinese Patent Office, Second Office Action mailed Jul. 19, 2011 in Chinese application No. 200880018741.5.

Chinese Patent Office, Decision of Rejection mailed Jan. 10, 2012 in Chinese application No. 200880018741.5.

* cited by examiner

SEMICONDUCTOR OPTICAL AMPLIFIER FOR AN EXTERNAL CAVITY DIODE LASER

BACKGROUND

In dense wavelength division multiplexing (DWDM) fiberoptic systems, multiple separate data streams propagate concurrently in a single optical fiber, with each data stream created by the modulated output of a laser at a specific channel frequency or wavelength. Channel separations of approximately 0.4 nanometers in wavelength, or about 50 gigahertz (GHz) are achievable, which allow up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity diode lasers (ECDLs) have been developed and are gaining their popularity due to superior optical performance, high reliability, and high manufacturing yield. External cavity lasers must be able to provide a stable, single mode output at selectable wavelengths while effectively suppress lasing associated with all other external cavity modes that are within the gain bandwidth of the cavity, which can be difficult to achieve.

A typical ECDL includes a gain medium diode with an antireflection-coated facet and a reflective or partially reflective facet, an end mirror, and a wavelength selection element (optical filter). The end mirror and reflective facet form an external laser cavity. The parameters of the gain medium are usually chosen to maximize the output power of the ECDL. The output power of the ECDL is maximized by, among other things, increasing gain and operating current of the gain medium. Typically, output power values attainable by ECDLs are in the range of 10 to 20 milliwatts (mW).

Although ECDL's usually provide higher optical power than integrated transmitters such as DFB lasers and distributed Bragg reflector (DBR) lasers, their output power is still a factor of two lower than what is demanded by some network builders. This power limitation is dictated by mode stability requirement and reliability concerns. Increasing a gain medium's gain and operating current to maximize ECDL output power may cause ECDL may become unstable in single mode and begin multimode lasing. In other words, the ECDL begins lasing at different frequencies simultaneously or hops between several frequencies. As described above, when the gain medium is used in an application such as a tunable ECDL in an optical communication system this instability may be unacceptable.

DETAILED DESCRIPTION

In various embodiments, an external cavity diode laser (ECDL) may be formed to enable generation of a higher power output beam without complexity of integration of passive components into a gain medium of the ECDL. That is, in various embodiments a gain chip or other gain medium may include two independent portions, namely a gain portion and a separate semiconductor optical amplifier (SOA). These independently controlled active portions may provide greater optical power than that possible using a conventional ECDL design. As used herein, "active" means that the gain/absorption peak of the material overlaps with the emission wavelength causing gain if biased positively and absorption if biased negatively. "Passive" means that that gain/absorption peak is detuned from the emission wavelength to a shorter wavelength (wider bandgap materials). This material does not amplify or absorb light. Instead, it changes its index of refraction if biased positively or negatively. Using such an embodiment, a tunable laser transmitter may be provided to enable output power of 40 milliwatts (mW) or more over an entire optical band such as a C-or L-band.

Figure 1:
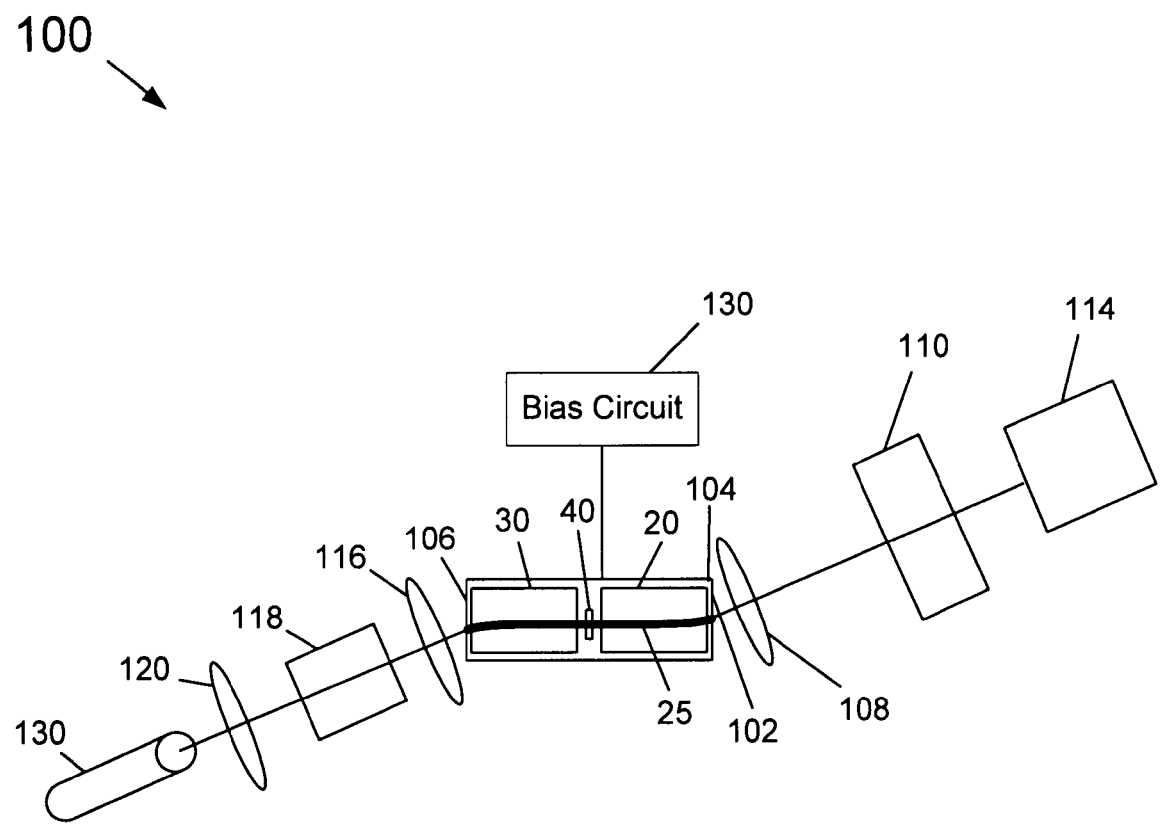
FIG. 1 is a block diagram of an external cavity diode laser in accordance with one embodiment of the present invention.

Referring now to FIG. 1, shown is a block diagram of an ECDL 100 configured for optical communication. ECDL 100 includes a gain medium that may take the form of a gain chip 102. Gain chip 102 may include a partially-reflective front facet 106 and a substantially non-reflective rear facet 104 coated with an anti-reflective (AR) coating to minimize reflections at its face. Optionally, gain chip 102 may have a bent-waveguide structure on the gain medium to realize the non-reflective rear facet 104. The external cavity elements include a collimating lens 108, one or more intracavity filter elements 110, and a reflective element 114. In general, reflective element 114 may be an external reflective element such as a mirror, grating, prism, other reflector or retroreflector that may also provide the tuning filter function in place of tuning element 110. As will be described further below, at least a portion of gain chip 102 may also be considered part of the cavity portion.

In addition to the ECDL cavity elements, ECDL 100 employs several output side elements used for isolation and data modulation. The output side elements illustrated in FIG. 1 include an output collimating lens 116, an optical isolator 118, a fiber coupling lens 120, and an output fiber segment 130, which may be a portion of an optical fiber.

In various embodiments, gain chip 102 may include a pair of sections or portions, namely a first portion 20 and a second portion 30. More specifically, first portion 20 may be a cavity gain portion, while second portion 30 may be a SOA portion. In this way, gain portion 20 may provide gain for the laser cavity and SOA portion 30 may amplify the output light along a waveguide 25 extending through gain chip 102. In various embodiments, each portion may be independently controlled with different anode electrodes and a common cathode electrode. However, in other implementations the electrodes for each of the portions may be entirely independent (i.e., separate cathode and anode electrodes). As shown in FIG. 1, a trench 40 may be formed between first portion 20 and second portion 30 to form an output mirror for the laser cavity. In this case facet 106 is made substantially non-reflective. This can be achieved by applying antireflective (AR) coating and/or bending the waveguide near the facet. In various embodiments, trench 40 may be formed using etching techniques or focused ion beam (FIB) milling. Trench 40 may be relatively narrow and shallow. For example, in one embodiment the width of trench 40 may be less than approximately 1 micron and may have a depth of less than approximately 4 microns, although the scope of the present invention is not limited in this regard.

As further shown in FIG. 1, a bias circuit 130 may be coupled to gain chip 102. Bias circuit 130 may provide a bias current to the anode electrodes of gain portion 20 and SOA portion 30.

Note that by controlling SOA portion 30 independently from gain portion 20, SOA portion 30 may act as a so-called shutter depending upon the polarity of the bias current provided. That is, if a negative bias is provided to SOA portion 30, it may act as a shutter, absorbing most of the light forwarded from gain portion 20. Such a negative bias may be provided when ECDL 100 is tuned from one channel to another to block dirty transient light from transmission along the optical fiber coupled thereto. When, however desired optical energy is provided to SOA portion 30, bias circuit 130 may provide a positive bias current to amplify the optical energy responsive to the level of the bias current.

Because gain chip 102 does not include any passive sections (higher bandgap material) that would require active/passive integration on a single substrate, inexpensive manufacturing and improved yields may be realized. Thus the need for complex processing steps such as regrowth or quantum well intermixing to integrate passive components (such as Bragg mirrors or phase modulators) with an active gain section can be avoided.

The basic operation of ECDL 100 is as follows. First and second controllable voltages are supplied to gain chip 102, and more specifically to gain portion 20 and SOA portion 30, respectively, resulting in a current across the diode junction, which produces an emission of optical energy (i.e., photons) that is gained in gain portion 20 and amplified in SOA portion 30. The emitted photons pass back and forth between partially-reflective integrated trench mirror 40 and reflective element 114, which collectively define the ends of an "effective" laser cavity (i.e., the two reflectors discussed above). As the photons pass back and forth, a plurality of resonances, or "lasing" modes are produced. All but one of the modes are suppressed by intracavity filter element 110. Under the only lasing mode, a portion of the optical energy (photons) temporarily occupies the external laser cavity and at the same time, a portion of the photons in the external laser cavity eventually passes through partially-reflective trench mirror 40.

Light including the photons that exit the laser cavity through partially-reflective trench mirror 40 passes through the SOA section 30, which multiplies the number of photons, and output collimating lens 116, which collimates the light into a light beam. The output beam then passes through optical isolator 118. Optical isolator 118 is employed to prevent back-reflected light from being passed back into the external laser cavity, and may be an optional element. After the light beam passes through the optical isolator, it is launched into output fiber 130.

Through appropriate modulation of the input current (generally for communication rates of up to 2.5 GHz) or through modulation of an external element disposed in the optical path of the output beam, data can be modulated on the output beam to produce an optical data signal. Such a signal then may be launched into fiber 130 and transmitted over a fiber-based network to provide very high bandwidth communication capabilities.

As discussed above, other types of tunable laser designs have been considered and/or implemented, including DFB and DBR lasers. Both DBR and DFB lasers are considered "integrated" lasers because all of the laser components are integrated in a common component. While this is advantageous for manufacturing, an integrated scheme means tuning is coupled to laser diode operation, resulting in lower tuning quality when compared with ECDLs.

For example, DFB lasers have a problem with aging. More specifically, as a DFB laser is used, the characteristics of the gain section change over time. This phenomena is known as "aging." Aging results in a wavelength shift, since the frequency reference and the active gain section are coupled in one chip. In contrast, the frequency reference (i.e., filter elements) is de-coupled from the gain chip for ECDL's, providing improved frequency stability over time.

The inherent advantage of the ECDL design over the highly integrated DFB and DBR designs is the fact that the tunable filter of the ECDL is decoupled from the gain region, and therefore can be made very stable. As a result, unlike DFB and DBR lasers, ECDL's may not require external wavelength lockers. The separate tuner in an ECDL may be controlled with essentially no cross-talk to other controlled parameters, such as laser diode current, and this can lead to simplified and more robust tuning algorithms than are typical of fully-integrated tunable lasers.

Figure 2:
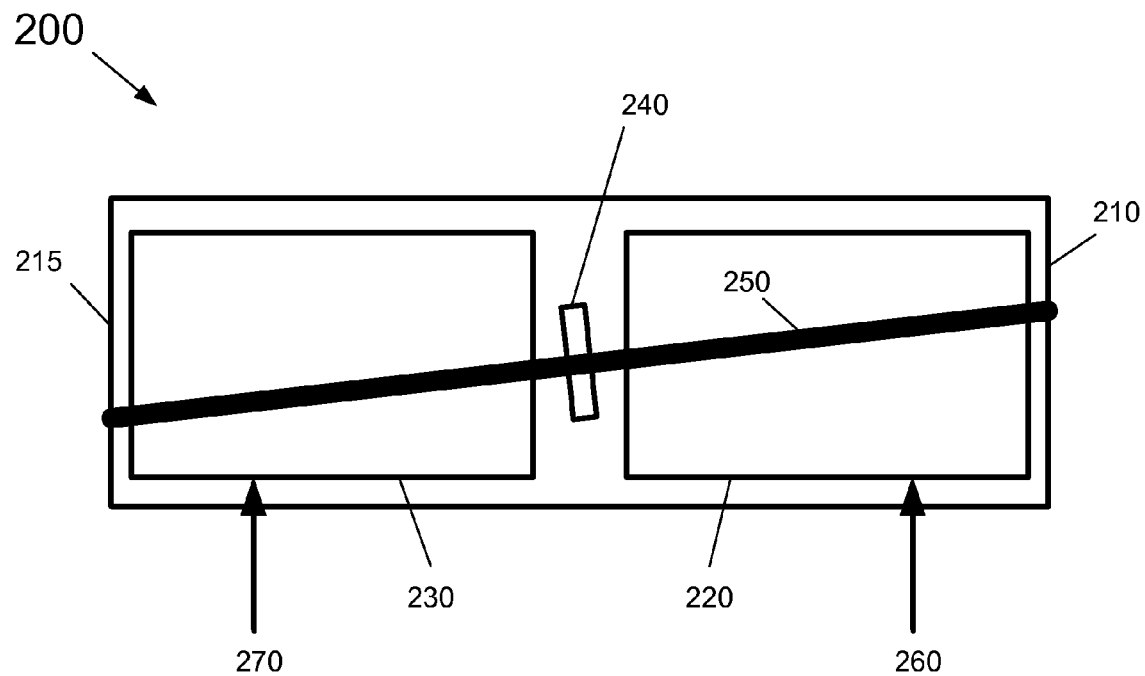
FIG. 2 is a block diagram illustrating a gain chip in accordance with an embodiment of the present invention.
Figure 3:
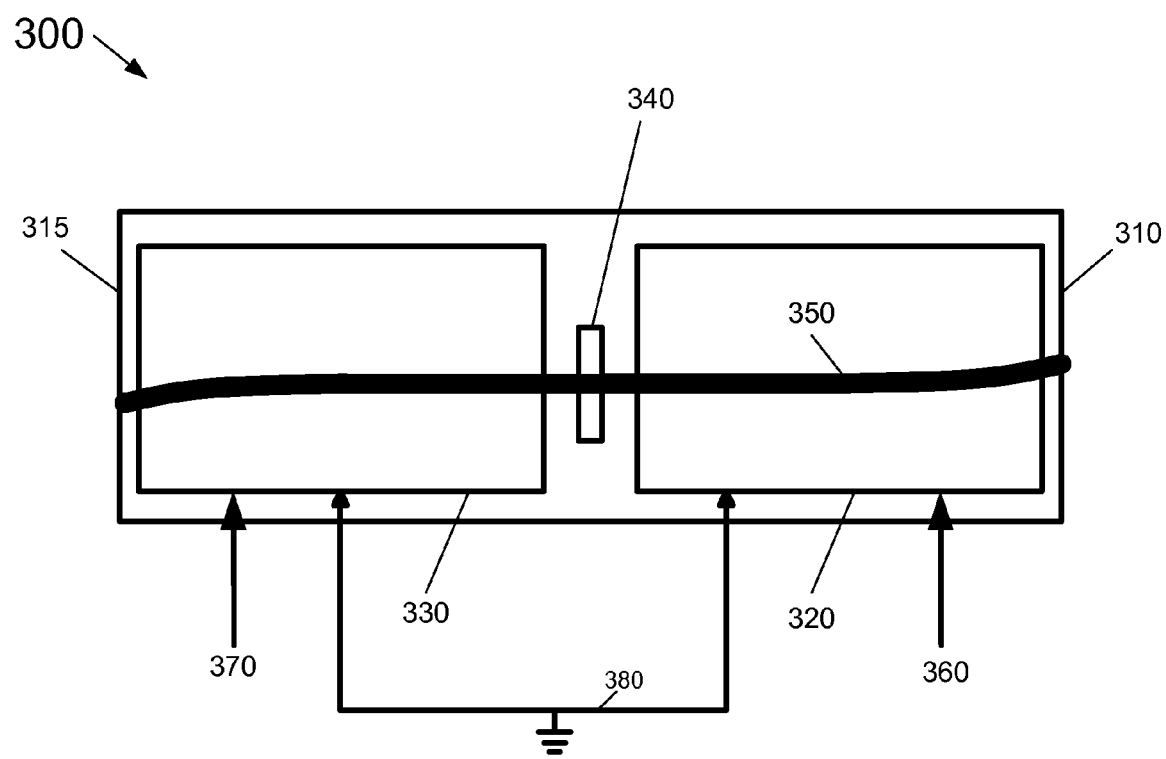
FIG. 3 is a block diagram illustrating a gain chip in accordance with another embodiment of the present invention.

Referring now to FIGS. 2 and 3, shown are alternate embodiments of gain chips having different features. Specifically, FIGS. 2 and 3 show implementations having differently configured waveguides that extend from a rear facet portion through a gain portion, a trench coupled thereto which may act as a mirror, to a SOA portion which in turn contacts a front facet of the gain chip. Referring to FIG. 2, gain chip 200 has a rear facet 210 and a front facet 215. A waveguide 250 is adapted throughout gain chip 200 such that it contacts rear facet 210, travels through gain section 220, passes through trench 240 and through SOA portion 230 to in turn mate with front facet 215. Note that in the embodiment of FIG. 2, waveguide 250 is configured such that it is angled (i.e., non-perpendicular) relative to each of rear and front facets 210 and 215. Note further in the embodiment of FIG. 2, trench 240 is configured to be perpendicular to waveguide 250. FIG. 2 also shows coupling of a first electrode 260 to gain portion 220 and a second electrode 270 to SOA portion 230. While not shown in the embodiment of FIG. 2, understand that either a common cathode or ground electrode may be present in both gain portion 220 and SOA portion 230 or separate ground electrodes may be present in the different portions of gain chip 200.

Referring to FIG. 3, gain chip 300 has a rear facet 310 and a front facet 315. A waveguide 350 is adapted throughout gain chip 300 such that it contacts rear facet 310, extends through gain section 320, through trench 340 and through SOA portion 330 to in turn mate with front facet 315. Note that in the embodiment of FIG. 3, waveguide 350 is configured such that it is curved. It is perpendicular relative to each of rear and front facets 310 and 315 in the central portion of the chip and angled (i.e., non-perpendicular) near rear and front facets 310 and 315. Note further in the embodiment of FIG. 3, trench 340 is configured to be perpendicular to waveguide 350. FIG. 3 also shows coupling of a first electrode 360 to gain portion 320 and a second electrode 370 to SOA portion 330. A common cathode or ground electrode 380 may be present in both gain portion 320 and SOA portion 330 or separate ground electrodes may be present in the different portions of gain chip 300.

In the embodiment of FIG. 2, waveguide 250 may be tilted providing a tilt of approximately 6 degrees at both facets. Note also in the embodiment of FIG. 2, trench 240 is configured to be perpendicular to waveguide 250. Thus in the embodiment of FIG. 2, a tilted waveguide geometry is employed. That is, in this configuration the plane in which trench 340 is formed is tilted at an angle relative to the crystalline plane structure of the substrate material from which gain chip 200 is formed. In contrast, gain chip 300 uses a bent waveguide geometry to achieve the same tilt near the facets. In this instance, trench 340 is parallel to the crystalline plane of the substrate material, while the waveguide/facet interfaces are still angled. To obtain this configuration, portions of waveguide 350 may be bent or radiused.

The angled and perpendicular waveguide/junction interfaces are configured as such to take advantage of well-known optical phenomena. More specifically, the optical phenomena concern the behavior of light as it passes between two materials having different indexes of refraction. Depending on the difference between the refractive indexes and angle of incidence, varying amounts of incident power will be reflected back. In the case of normal incidence, substantially all the reflected light is coupled into the waveguide while in the case of the angled incidence (optimum is about 6 degrees) most of the reflected light leaves the waveguide (gets scattered) and therefore does not interact with the cavity light.

With the foregoing optical phenomena in mind, in one embodiment a trench may be formed by removing or altering a planar portion of material between gain and SOA sections to form a gap between the two sections. This creates two material air interfaces with associated differences between the indexes of refraction. These index of refraction differences along with the perpendicular configuration produces a partial reflection at the gap, resulting in a low reflectivity mirror (i.e., 2-10%). Thus, a trench defines one of the reflectors for an effective laser cavity of an ECDL (e.g., reflective element 40 of FIG. 1), with the other end of the laser cavity defined by an external reflective element (e.g., reflective element 114 of FIG. 1).

In various embodiments, a gain medium may include a substrate layer and an active layer. The active layer may have quantum wells and barrier layers. The barrier layers may be n- or p-doped indium phosphide (InP) layers. The quantum well layers may be indium gallium arsenide phosphide (InGaAsP) layers. In addition, there may be one or more dopants in the barrier layers. In one embodiment of the present invention, the barrier layers may be doped with an n-type dopant, such as sulfur (S), selenium (Se), tellurium (Te), or other suitable dopant to control (e.g., reduce) the transparency current (Itr) of the gain medium. There may be a crystalline lattice mismatch between the material in the quantum well layer and the material in the barrier layer (also called strained quantum wells or strained layer structures).

Figure 4:
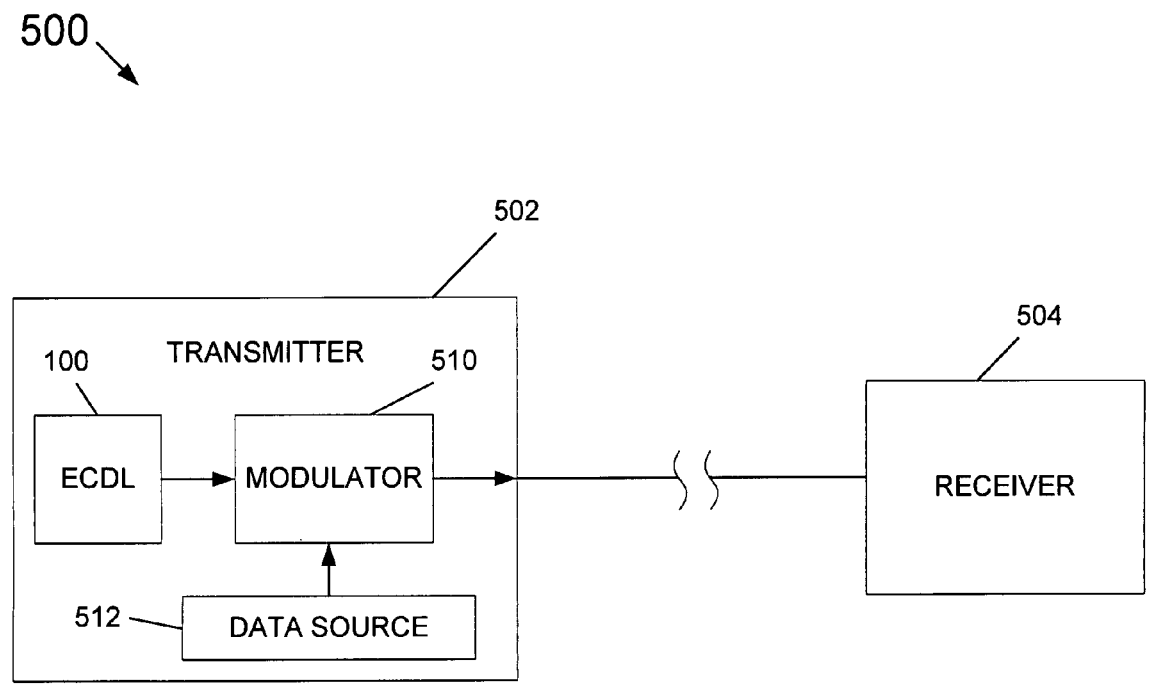
FIG. 4 is a block diagram of a system in accordance with one embodiment of the present invention.

FIG. 4 is a high-level block diagram of an optical system 500 according to an embodiment of the present invention. The example optical system 500 includes a transmitter 502 that transmits an optical signal to a receiver 504, and which may be coupled by an optical fiber. The transmitter 502 may include the ECDL 100, a modulator 510, and a data source 512. The data source 512 provides the data to be transmitted in the optical system 500. For example, the data source 512 may provide data, voice, graphics, video, etc. The modulator 510 modulates a laser beam from ECDL 100 according to the data from the data source 512.

Figure 5:
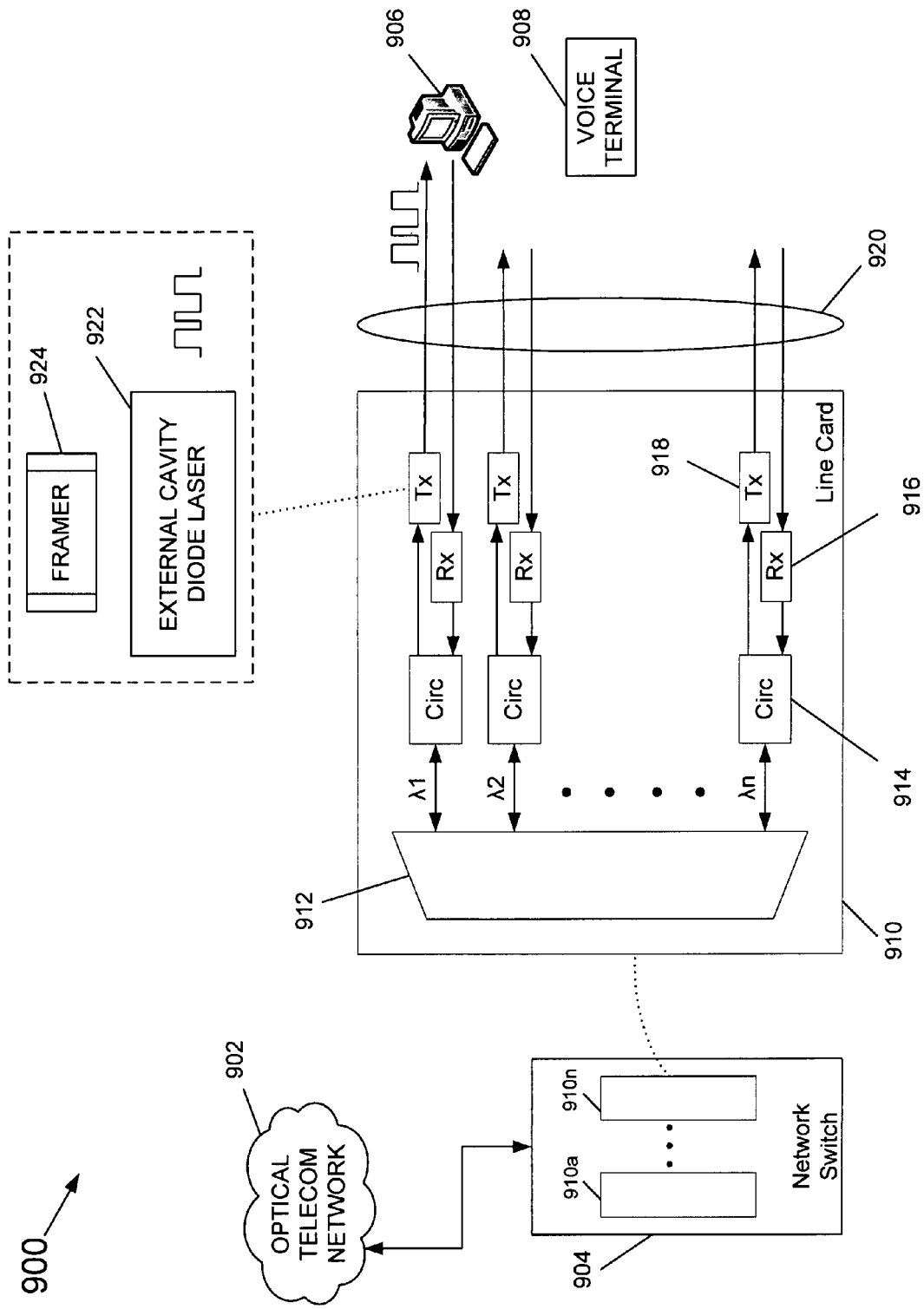
FIG. 5 is a block diagram of a system in accordance with another embodiment of the present invention.

FIG. 5 shows a communication system 900 in accordance with another embodiment of the present invention in which an optical network is coupled to a plurality of data and voice subscribers lines by an optical system utilizing tunable ECDL's. The communication system includes an optical network 902, a network switch 904, a data terminal 906, and a voice terminal 908. The modulated data may be carried on a number of channels in multiple access protocols including but not limited to: wavelength division multiplexing (WDM), dense wavelength division multiplexing (DWDM), frequency division multiple access (FDMA), or the like.

Network switch 904 provides network switching operations, facilitated by optical transceivers that are mounted on fiber line cards 910. Each fiber line card includes a multi-state multiplexer/demultiplexer (mux/demux) 912, a circulator bank including circulators 914, a receiver bank including receivers 916, and a transmitter bank including transmitters 918. The mux/demux is a passive optical device that divides wavelengths (or channels) from a multi-channel optical signal, or combines various wavelengths (or channels) on respective optical paths into one multi-channel optical signal depending on the propagation direction of the light.

In the receive mode, after de-multiplexing, each individual channel is passed via a corresponding circulator 914 within the circulator bank to a corresponding receiver 916 in the receiver bank. Each receiver 916 may include a photodetector, framer, and decoders (not shown). Switches (not shown) couple the receiver over a corresponding one of subscriber lines 920 to a data or voice terminal 906 or 908, respectively.

In the transmit mode, each line card transmitter bank includes a bank of lasers 922, including n (e.g., 128) ECDLs radiating light at one of the selected center frequencies of each channel of the telecommunications wavelength grid. Each subscriber datastream is optically modulated onto the output beam of a corresponding ECDL having a construction and operation in accordance with an embodiment of the invention discussed above. A framer 924 permits framing, pointer generation and scrambling for transmission of data from the bank of semi-integrated ECDLs and associated drivers. The modulated information from each of the lasers is passed via a corresponding circulator into mux/demux 912, which couples the output to a single optical fiber for transmission. The operation of the fiber line card in the embodiment shown is duplex, meaning that bi-directional communications are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an integrated structure having front and rear facets optically connected via a waveguide passing therethrough, the integrated structure further including:
   a gain section to provide a gain operation on optical energy in an external cavity laser, the gain operation controlled by a first electrical signal, wherein the gain section is part of the external cavity laser and is coupled to a first independent electrode and a common electrode;
   a semiconductor optical amplifier (SOA) section disposed adjacent to the gain section to amplify the optical energy emitted by the external cavity laser responsive to a second electrical signal, the SOA section coupled to a second independent electrode and the common electrode;
   a trench mirror having a width and a depth within a substrate of the integrated structure disposed between the gain section and the SOA section, wherein the gain section and the SOA section are formed in an active layer having quantum well layers and barrier layers without integration of passive components; and a bias circuit coupled to provide an independent bias current to each of the first and second independent electrodes, wherein the SOA section is to shutter substantially all of the optical energy emitted by the external cavity laser during tuning from a first channel to a second channel when the bias circuit provides a negative bias to the second independent electrode.

2. The apparatus of claim 1, wherein the trench minor is formed via a focused ion beam (FIB) operation.

3. The apparatus of claim 1, wherein the front and rear facets include an anti-reflective coating.

4. The apparatus of claim 1, wherein the integrated structure does not include a passive component.

5. The apparatus of claim 4, wherein the integrated structure comprises a substrate including the gain section and the SOA section, the substrate having a plurality of semiconductor layers formed thereon, the integrated structure including only active components.

6. The apparatus of claim 5, wherein a crystalline lattice mismatch exists between a material of the quantum well layers and a material of the barrier layers.

7. The apparatus of claim 1, wherein the SOA section of the integrated structure is to provide a gain greater than approximately 3 decibels (dB) to the optical energy.

8. The apparatus of claim 1, wherein the waveguide is bent such that it is substantially perpendicular to the front and rear facets of the integrated structure proximate to the trench mirror and angled relative to the front and rear facets of the integrated structure proximate to the front and rear facets, wherein the trench minor is parallel to a crystalline plane of the substrate of the integrated structure.

9. An apparatus comprising:

an external cavity portion of an external cavity laser including a collimating lens, a filter, and a reflective portion;

a gain medium of the external cavity laser, the gain medium having a front facet and a substantially non-reflective rear facet optically coupled via a waveguide passing therethrough, the gain medium further including:

a gain section to gain spontaneous emission in response to a first electrical signal and coupled to a first independent electrode and a common electrode; and a semiconductor optical amplifier (SOA) section coupled to the gain section via a trench minor having a width and a depth within a material of the integrated structure to amplify the optical energy emitted by the external cavity laser in response to a second electrical signal, wherein the SOA section is coupled to a second independent electrode and the common electrode and the gain section and the SOA section are formed in an active layer having quantum well layers and barrier layers without integration of passive components and having a crystalline lattice mismatch between the quantum well layers and the barrier layers; and a bias circuit coupled to provide an independent bias current to each of the first and second independent electrodes, wherein the SOA section is to shutter substantially all of the amplified optical energy when the bias circuit provides a negative bias to the second independent electrode during tuning from a first channel to a second channel.

10. The apparatus of claim 9, wherein the gain medium comprises a substrate including the gain section and the SOA section, the substrate having a plurality of semiconductor layers formed thereon, the gain medium including only active components, and further comprising a bias circuit to provide the first electrical signal and the second electrical signal.

11. The apparatus of claim 9, wherein the waveguide is bent such that it is substantially perpendicular to the front and rear facets proximate to the trench minor and angled relative to the front and rear facets proximate to the front and rear facets, wherein the trench minor is parallel to a crystalline plane of the integrated structure material.

* * * * *

UNITED STATES PATENT AND TRADEMARK OFFICE
CERTIFICATE OF CORRECTION

| | | |
|---|---|---|
| PATENT NO. | : 8,213,804 B2 | Page 1 of 1 |
| APPLICATION NO. | : 11/810433 | |
| DATED | : July 3, 2012 | |
| INVENTOR(S) | : Sergei Sochava | |

It is certified that error appears in the above-identified patent and that said Letters Patent is hereby corrected as shown below:

Column 7:
Line 12, "minor" should be --mirror--

Column 7:
Line 34, "minor" should be --mirror--

Column 8:
Line 7, "minor" should be --mirror--

Column 8:
Line 34, "minor" should be --mirror--

Column 8:
Line 36, "minor" should be --mirror--

Signed and Sealed this
Twenty-eighth Day of August, 2012

David J. Kappos
*Director of the United States Patent and Trademark Office*